United States Patent
Elkouby et al.

(10) Patent No.: US 12,109,628 B2
(45) Date of Patent: Oct. 8, 2024

(54) CUTTING TOOL WITH A TiAlN COATING HAVING RAKE AND RELIEF SURFACES WITH DIFFERENT RESIDUAL STRESSES

(71) Applicant: ISCAR, LTD., Tefen (IL)

(72) Inventors: Marcel Elkouby, Haifa (IL); Tomer Weinberger, Gilon (IL); Anton Nikitin, Haifa (IL)

(73) Assignee: ISCAR, LTD., Tefen (IL)

( * ) Notice: Subject to any disclaimer, the term of this patent is extended or adjusted under 35 U.S.C. 154(b) by 0 days.

(21) Appl. No.: 17/885,233

(22) Filed: Aug. 10, 2022

(65) Prior Publication Data
US 2024/0051033 A1    Feb. 15, 2024

(51) Int. Cl.
*B32B 27/14*    (2006.01)
*B23B 27/14*    (2006.01)
(Continued)

(52) U.S. Cl.
CPC ............ *B23B 27/148* (2013.01); *C23C 16/34* (2013.01); *C23C 16/36* (2013.01); *C23C 16/56* (2013.01);
(Continued)

(58) Field of Classification Search
CPC .............. B32B 27/148; B32B 2228/04; B32B 2228/10; C23C 16/34; C23C 16/36;
(Continued)

(56) References Cited

U.S. PATENT DOCUMENTS

| 6,040,012 A | 3/2000 | Anderbouhr et al. |
| 7,544,024 B2 | 6/2009 | Omori et al. |

(Continued)

FOREIGN PATENT DOCUMENTS

| EP | 3 441 167 A1 | 2/2019 |
| JP | 5574277 B2 | 8/2014 |

(Continued)

OTHER PUBLICATIONS

International Search Report dated Nov. 29, 2023, issued in PCT counterpart application No. PCT/IL2023/050746.
(Continued)

*Primary Examiner* — Kevin C T Li
(74) *Attorney, Agent, or Firm* — Womble Bond Dickinson (US) LLP

(57) ABSTRACT

A metal cutting insert has a substrate body of cemented carbide, cermet, or ceramic and at least one cutting edge defined between a rake face and a relief face. The cutting insert has a CVD coating including a layer of aluminum titanium nitride having a cubic face centered lattice structure, represented by a formula $(Al_xTi_{1-x}M_y)C_zN_{1-z}$ wherein a stoichiometry coefficient of aluminum is $0.30<x<0.95$, wherein M is at least one element selected from the group consisting of Cl and Ar, with a stoichiometry coefficient of which is $0\leq y<0.01$, and wherein a stoichiometry coefficient of carbon is $0\leq z<0.3$. The $(Al_xTi_{1-x}M_y)C_zN_{1-z}$ layer satisfies a relationship $10<|S_1-S_2|<500$ MPa wherein $S_1$ is the residual stress measured on the rake face, and $S_2$ is the residual stress measured on the relief face.

24 Claims, 7 Drawing Sheets

(51) Int. Cl.
*C23C 16/34* (2006.01)
*C23C 16/36* (2006.01)
*C23C 16/56* (2006.01)

(52) U.S. Cl.
CPC ....... *B23B 2228/04* (2013.01); *B23B 2228/10* (2013.01)

(58) Field of Classification Search
CPC . C23C 16/56; B22F 3/24; C22C 33/02; C22C 38/16
See application file for complete search history.

(56) References Cited

U.S. PATENT DOCUMENTS

| | | | |
|---|---|---|---|
| 9,976,213 | B2 | 5/2018 | Stiens et al. |
| 2007/0172675 | A1* | 7/2007 | Omori ................... C23C 30/005 428/701 |
| 2012/0282049 | A1 | 11/2012 | Okada et al. |
| 2015/0158094 | A1* | 6/2015 | Igarashi ............... C23C 16/0272 427/249.19 |
| 2018/0216224 | A1 | 8/2018 | Stiens et al. |
| 2021/0299758 | A1 | 9/2021 | Shirochi et al. |
| 2023/0073338 | A1 | 3/2023 | Kubo et al. |

FOREIGN PATENT DOCUMENTS

| | | | | |
|---|---|---|---|---|
| JP | 2015214015 A | * | 12/2015 | ............. B23B 27/14 |
| WO | WO 2020/079952 A1 | | 4/2020 | |

OTHER PUBLICATIONS

Written Opinion dated Nov. 29, 2023, issued in PCT counterpart application No. PCT/IL2023/050746.

* cited by examiner

CUTTING TOOL WITH A TiAlN COATING HAVING RAKE AND RELIEF SURFACES WITH DIFFERENT RESIDUAL STRESSES

FIELD OF THE INVENTION

The present invention relates to a metal cutting insert coated with at least one layer comprising aluminum, titanium and nitrogen applied by chemical vapor deposition. This layer having a different residual stress on a rake face and on a relief face of up to 500 MPa, and a method of producing the same. The present invention also relates to a system for metal cutting comprising an insert holder and at least one such metal cutting insert.

BACKGROUND ART

Metal cutting tools, particularly cutting inserts, have a hard substrate of cemented carbide, cermet, ceramic or steel and are typically coated with a hard material coating that improve the wear or cutting properties. Known coatings of metal cutting tools include layers of carbides, nitrides, oxides, carbonitrides, oxynitrides, oxycarbides, oxycarbonitrides, borides, boronitrides, borocarbides, borocarbonitrides, boroxynitrides, boroxycarbides or boroxycarbonitrides of the elements of groups IVa to VIIa of the periodic system and/or aluminum, mixed metal phases and phase mixtures of the afore-mentioned compounds. Examples of the afore-mentioned compounds are $Al_2O_3$ and titanium-based coatings such as TiN, TiC, TiCN, and TiAlN. These coatings are applied by CVD methods (chemical vapor phase deposition), MT-CVD methods, (medium temperature chemical vapor deposition), PCVD methods (plasma-supported CVD methods) or by PVD methods (physical vapor phase deposition). Coating layers comprising titanium and nitrogen, generally have lower oxidation temperatures than coatings comprising titanium, nitrogen, and aluminum seeing as the latter group of coating layers form a thin surface layer of aluminum oxide during hot, dry machining applications. A higher aluminum content further increases the hardness.

Deposition methods by CVD of cubic titanium aluminum nitride coatings (TiAlN) are well known and described in, by way of example, Czettl, Christoph & Schleinkofer, U & Schedle, F & Wolf, C & Lechleitner, M & Holzschuh, Helga & Bürgin, W. (2017). *CVD TiAlN Development and challenges for use in mass production History and development of CVD-TiAlN*, 19th Plansee Seminar, June 2017. One of the advantages of cubic face centered TiAlN deposited by CVD over TiAlN deposited by PVD is that a TiAlN layer deposited by CVD may have a thickness greater than that of a TiAlN layer deposited by PVD thus increasing tool life. Another advantage is that the aluminum content of cubic CVD TiAlN may be higher, i.e., over 60% or over 70% of the metal content of the coating, than the aluminum content of a cubic PVD TiAlN layer, imparting to a high aluminum CVD TiAlN layer superior oxidation resistance. Some CVD TiAlN coatings may have a preferential orientation or structure.

Residual stresses may form after coating at elevated temperatures, for example, between the coating and the substrate, and/or between the individual layers of the coating, as a result of different coefficients of thermal expansion of different materials. Typically, CVD coatings exhibit tensile residual stresses after deposition although there are CVD processes that result in coatings with compressive residual stresses. Residual stresses are known to affect the wear resistance of metal cutting inserts and the adhesion of their coating to their substrate.

Residual stress is usually measured in a non-destructive and phase selective X-ray diffraction method such as the $sin^2\Psi$ method, the Universal Plot method, or the Single Tilt method. It is known to a skilled person that repeated residual stress measurements in same place on a sample will not give identical measurements but will be within a standard deviation that, within this range, will be considered to have the same residual stress (see e.g., He, Baoping Bob and Kingsley L. Smith. "Strain and Stress Measurements with a Two-Dimensional Detector." (1999)). Occasionally the geometry of the cutting insert complicates measurement of residual stress, but there are known methods of overcoming this issue.

Post coating mechanical surface treatments regulating the residual stress in the coating of a cutting tool are typically advantageous as surface cracks are prevented or closed thereby and the fatigue properties of the coating are improved, and the lifetime of the cutting insert is extended. These post coating treatments, including, by way of example, blasting, shot peening, or brushing of cutting inserts coated with a CVD layer, a PCVD layer or a PVD layer, are known to reduce the tensile residual stress or increase the compressive residual stress of an outer layer(s) of the coating, or of the entire coating, or even the substrate. However, compression stresses above a certain point can lead to adhesion problems and spontaneous fragmentation, chipping or separation of a surface coating. Post coating treatments are also used to modify the surface roughness, or to at least partially remove the uppermost layer on the rake face and/or relief face and/or on the cutting portion, and/or to increase the hardness of coating. Residual stresses are usually specified in units of Mega-pascal (MPa) wherein tensile residual stresses have a positive sign "+" while compressive residual stresses have a negative sign "−".

Examples of various, and somewhat contradictory, published desirable residual stress ranges of a CVD TiAlN layer in coatings for cutting inserts include residual stresses of, by way of examples, between 300 and −5000 MPa, or alternatively, between −0.4 and −0.3 GPa, or between −0.5 GPa to −5 GPa within 500 m from the cutting edge, as well as, a formula giving a difference between a maximum value and a minimum value of the residual stress of any one of the rake, flank, or cutting edge is from 0.5 GPa to 3 GPa such as WO 2020/079952, or, confusingly, from 3 GPa to 5 GPa.

A common cause of failure of cutting tools coated with the above-mentioned coatings in applications such as milling or turning is chipping on the rake and/or cutting edge.

SUMMARY OF THE INVENTION

It is therefore an object of the present invention to provide metal cutting inserts for machining of refractory metals, hard metals, and iron-based materials, particularly cast irons and stainless steels. The metal cutting insert according to an aspect of the invention is coated with a coating including at least a layer of an aluminum titanium nitride layer deposited in a chemical vapor deposition (CVD) process, the coated cutting insert having improved toughness, improved resistance to chipping and longer tool life over the state of the art, with an upper limit on the difference of the residual stress of the rake face and of the relief face after blasting of the rake face and/or the relief face.

In one aspect the present invention is directed to a metal cutting insert comprising a substrate body and a CVD coating. The substrate body comprises cemented carbide, cermet, or ceramic, and has at least one rake face and at least one relief face that intersect to form a cutting edge. The coating is formed on the substrate body by a chemical vapor deposition process and comprises one or more layers. At least one layer has a composition comprising aluminum, titanium and nitrogen and therefore is considered a TiAlN coating. The present TiAlN coating has a cubic face centered lattice structure, represented by a formula $(Al_xTi_{1-x}M_y)C_zN_{1-z}$, wherein: a stoichiometry coefficient of aluminum is $0.30<x<0.95$, M is at least one element selected from the group consisting of Cl and Ar, with a stoichiometry coefficient of M being $0 \le y<0.01$, and a stoichiometry coefficient of carbon is $0 \le z<0.3$. Additionally, the $(Al_xTi_{1-x}M_y)C_zN_{1-z}$ layer satisfies a relationship $10<|S_1-S_2|<500$ MPa, wherein $S_1$ is the residual stress measured on the rake face, and $S_2$ is the residual stress measured on the relief face.

The coating may exhibit any non-conflicting combination of the following features:
(a) Preferably, the stoichiometric coefficient of aluminum is $0.50<x<0.95$, more preferably $0.67<x<0.95$, and most preferably $0.80<x<0.90$.
(b) Preferably, the stoichiometric coefficient of M is $0 \le y<0.005$.
(c) The layer satisfies $10<|S_1-S_2|<400$ MPa and most preferably $10<|S_1-S_2|<350$.
(d) The stoichiometric coefficient of M can be y=0.
(e) The stoichiometric coefficient of carbon can be z=0.
(f) The chemical vapor deposition process can be without plasma activation.
(g) The thickness of the coating can be between 2 to 25 m, preferably between 3 to 20 m, most preferably 4 to 15 m.
(h) The residual stress $S_1$ measured on the rake face can be $|S_1|<3100$ MPa, preferably $|S_1|<2800$ MPa, more preferably $-2200<S_1<2400$ MPa.
(i) The residual stress $S_2$ measured on the relief face can be $|S_2|<2800$ MPa, preferably $|S_2|<2500$ MPa, more preferably $-1700<S_2<1900$ MPa.
(j) The coating may further comprise one or more additional layers of carbides, nitrides, oxides, carbonitrides, oxynitrides, oxycarbides, oxycarbonitrides, borides, boronitrides, borocarbides, borocarbonitrides, boroxynitrides, boroxycarbides or boroxycarbonitrides of the elements of groups IVa to VIIa of the periodic system and/or aluminum, mixed metal phases and phase mixtures of the afore-mentioned compounds.
  (i) At least one of the additional layers is selected from the group consisting of TiN and TiCN, and is positioned between the substrate body and the $(Al_xTi_{1-x}M_y)C_zN_{1-z}$ layer.
  (ii) The substrate body may be formed of cemented carbide.
  (iii) None of the one or more additional layers is an alumina layer.
(k) The $(Al_xTi_{1-x}M_y)C_zN_{1-z}$ layer satisfies a relationship $|HV_1-HV_2|<500$, wherein $HV_1$ is the Vickers hardness measured on the rake face, and wherein $HV_2$ is the Vickers hardness measured on the relief face.
  (i) Preferably, $|HV_1-HV_2|<300$, and most preferably $|HV_1-HV_2|<100$.
  (ii) Preferably, $2300<HV_1<4200$, preferably $2600 \le HV_1<3800$ and more preferably $2900 \le HV_1<3400$.
  (iii) Preferably, $2400 \le HV_2<4000$, more preferably $2700 \le HV_2<3600$ and most preferably $3000 \le HV_2<3500$.
(l) The $(Al_xTi_{1-x}M_y)C_zN_{1-z}$ layer has a Vickers hardness $HV_1$ measured on the rake face and a Vickers hardness $HV_2$ measured on the relief face, wherein $2300<HV_1<4200$ and $2400 \le HV_2<4000$.
  (i) Preferably, $2600 \le HV_1<3800$ and more preferably $2900 \le HV_1<3400$.
  (ii) Preferably, $2700 \le HV_2<3600$ and more preferably $3000 \le HV_2<3500$.
(m) The coating includes a layer of TiN deposited over the $(Al_xTi_{1-x}M_y)C_zN_{1-z}$ layer, which is over the substrate body.

In another aspect, the present invention is directed to a method of producing a coated cutting insert having a substrate body and a CVD coating. The substrate body comprises cemented carbide, cermet, or ceramic, and has at least one rake face and at least one relief face that intersect to form a cutting edge. The coating includes at least one layer comprising aluminum, titanium and nitrogen having a cubic face centered lattice structure. The at least one layer is represented by a formula $(Al_xTi_{1-x}M_y)C_zN_{1-z}$ wherein a stoichiometry coefficient of aluminum is $0.30<x<0.95$, M is at least one element selected from the group consisting of Cl and Ar and a stoichiometry coefficient of M is $0 \le y<0.01$, and a stoichiometry coefficient of carbon is $0 \le z<0.3$. The method comprises applying the at least one layer by a CVD process, followed by subjecting the coating to a blasting treatment, wherein the blasting pressure, the blasting duration, the blasting media, and/or the blasting angle of the blasting treatment are so selected that after the blasting treatment, the $(Al_xTi_{1-x}M_y)C_zN_{1-z}$ layer satisfies a relationship $10<|S_1-S_2|<500$ MPa, wherein $S_1$ is the residual stress measured on the rake face, and wherein $S_2$ is the residual stress measured on the relief face.

The method may include any non-conflicting combination of the following:
(n) Preferably, the CVD process results in the stoichiometry coefficient for aluminum being $0.50<x<0.95$, more preferably being $0.67<x<0.95$, and most preferably being $0.80<x<0.90$.
(o) Preferably, the CVD process results in the stoichiometry coefficient for M being $0 \le y<0.005$.
(p) Preferably, the CVD process results in the thickness of the $(Al_xTi_{1-x}M_y)C_zN_{1-z}$ layer being between 2 to 25 m, more preferably between 3 to 20 m, and most preferably between 4 to m.
(q) Preferably, the blasting treatment results in the residual stresses $S_1$, $S_2$ satisfying the relationship $10<|S_1-S_2|<400$ MPa, and more preferably results in the residual stresses $S_1$, $S_2$ satisfying the relationship $10<|S_1-S_2|<350$ MPa.
(r) Preferably, the blasting treatment results in the $(Al_xTi_{1-x}M_y)C_zN_{1-z}$ layer having a Vickers hardness $HV_1$ measured on the rake face and a Vickers hardness $HV_2$ measured on the relief face satisfying the relationship $|HV_1-HV_2|<500$.
  (i) More preferably, the blasting treatment results in $HV_1$ and $HV_2$ satisfying the relationship $HV_1-HV_2|<300$, and most preferably satisfying the relationship $|HV_1-HV_2|<100$.
(s) In another aspect, the present invention is directed to a metal cutting tool comprising an insert holder and at least one metal cutting insert of the sort described above mounted on the insert holder.

DESCRIPTION OF THE INVENTION

Figure 7:
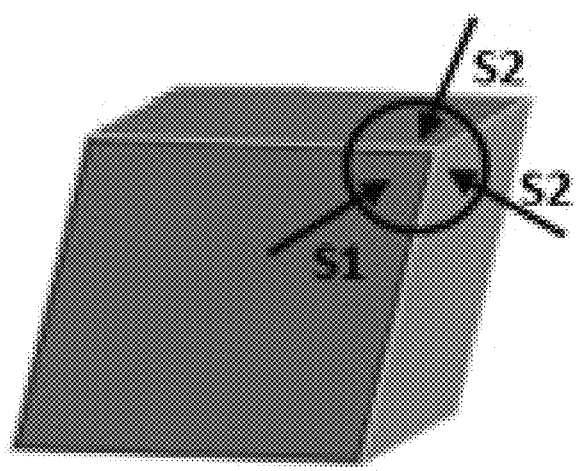
FIG. 7: A working corner of an insert.

The object is attained by a metal cutting insert (hereinafter referred to as "cutting insert") made of a substrate of a cemented carbide, cermet, or ceramic; the substrate body comprises at least one rake face and at least one relief face that intersect to form a cutting edge having at least one working corner as shown in FIG. 7 and a coating formed on the substrate by a chemical vapor deposition process, the coating having one or more layers wherein at least one layer has a composition comprising aluminum, titanium and nitrogen having a cubic face centered lattice structure, represented by a formula $(Al_xTi_{1-x}M_y)C_zN_{1-z}$ wherein a stoichiometry coefficient of aluminum is $0.3<x<0.95$, preferably $0.5<x<0.95$, more preferably $0.67<x<0.95$, and advantageously $0.8<x<0.90$, wherein M is at least one element selected from the group consisting of Cl and Ar, and a stoichiometry coefficient of M is $0 \leq y<0.01$, preferably $0 \leq y<0.005$, and wherein a stoichiometry coefficient of carbon is $0 \leq z<0.3$ characterized in that the $(Al_xTi_{1-x}M_y)C_zN_{1-z}$ layer satisfies a relationship $10<|S_1-S_2|<500$ MPa, preferably $10<|S_1-S_2|<400$ MPa most preferably $10<|S_1-S_2|<350$ MPa wherein $S_1$ is the residual stress measured on the rake face and $S_2$ is the residual stress measured on the relief face.

It was surprisingly found that a cutting insert according to the invention with a coating within these parameters has improved wear resistance, particularly to chipping, over known cutting inserts and accordingly a longer tool life (e.g., when mounted on an insert holder and used in a metal cutting process), particularly in the milling of steel or cast-iron materials and turning of iron-based workpieces over known cutting inserts whose tool life may be cut short by relief face wear, or crater wear, or chipping at the cutting edge, especially in milling, due to thermal fatigue from thermal cyclic loads that result in stress cracks along the cutting edge, which reach completely through the coating eventually causing sections of carbide to pull out and end up as chipping.

Particularly, the combination of the regulation of the residual stress of the CVD $(Al_xTi_{1-x}M_y)C_zN_{1-z}$, preferably high aluminum $(Al_xTi_{1-x}M_y)C_zN_{1-z}$ layer, $S_1$ and $S_2$ on the rake and the relief faces of the working corner respectively to their defined respective ranges as discussed below, and the control of the difference of residual stress, $|S_1-S_2|$, to be less than 500 MPa results in cutting inserts with increased resistance to chipping, improved wear resistance and significantly longer tool life.

The residual stress $S_1$ is preferably within the range $|S_1|<3100$ MPa. In some embodiments residual stress $S_1$ is with the range $|S_1|<2800$ MPa and in other embodiments $-2200 \leq S_1<2400$ MPa.

The tool life is reduced if $S_1$ has residual stress in excess of 3100 MPa. The inventors found that the wear resistance of cutting tools was improved within the entire range of $S_1$ mentioned above. Compressive stresses lead to increased tool life, however compressive stresses that are too high can lead to spalling.

The residual stress $S_2$ is preferably within the range $|S_2|<2800$ MPa. In some embodiments the residual stress $S_2$ is within the range $|S_2|<2500$ MPa and in other embodiments $-1700 \leq S_2<1900$ MPa. The inventors found that the wear resistance of cutting tools was improved within the cited range of $S_2$ by reducing chipping and improved toughness.

The $(Al_xTi_{1-x}M_y)C_zN_{1-z}$ layer can have a thickness of 2 to 15 m, preferably 3 to 15 m, most preferably 4 to 10 m. The coating may have a thickness of 2 to 25 m, preferably between 3 to 20, most preferably 4 to 15 m.

Tensile stress typically occurs in CVD coatings due to a difference between the thermal expansion coefficients of the substrate and the coating layer. Generally, reduction of tensile residual stress or introduction of compressive residual stress in the coating, typically on a rake face and/or on a cutting edge, is desirable as surface cracks are prevented or closed thereby and this improves the fatigue properties of the coating and thereby of the tool. The regulation of residual stress is obtained by a post coating treatment such as brushing, blasting, shot peening etc. Frequently, the post coating treatment is continued until a residual compressive stress is obtained. Compressive stresses generally lead to better wear resistance especially for adhesive wear at high temperature, however too high compressive stresses can lead to cohesive and/or adhesive spalling, adhesion problems and to chipping of the coating.

Without being bound to any theory, the regulation of the difference in residual stress between the rake face and the relief face, after a post coating treatment to improve fatigue properties, is believed to reduce the strain in the $(Al_xTi_{1-x}M_y)C_zN_{1-z}$ layer at the cutting edge where these two faces are adjacent to each other during use of the cutting insert. It was found that aluminum titanium nitride coatings exhibit a unique behavior in that the flank and/or rake relief faces should be treated so that the resulting strain in the $(Al_xTi_{1-x}M_y)C_zN_{1-z}$ layer on both faces will be in the ranges defined in claim 1 otherwise non-homogeneous mechanical properties at the cutting edge will negatively impact the tool life. Preferably, the residual stress in the $(Al_xTi_{1-x}M_y)C_zN_{1-z}$ layer on the rake face and/or on the relief face are treated so that the tensile residual stress is reduced, or alternatively, compressive residual stress is introduced into the $(Al_xTi_{1-x}M_y)C_zN_{1-z}$ layer are within the specific ranges of $S_1$ and $S_2$ described above. Preferably the Vickers hardness in the $(Al_xTi_{1-x}M_y)C_zN_{1-z}$ layer on both faces will be in the ranges defined in claim 10.

The substrate of the cutting insert may be a shape commonly used for cutting inserts, for example, a top view of the cutting insert may be a square, a rhomboid, a triangle, a circle, ellipse etc. Preferably the cutting insert should be a milling cutting insert. The substrate includes at least one relief face and at least one rake face. The relief face, also known as a flank face, and the rake face are connected to each other with a cutting-edge line. The expressions such as "relief face", "rake face", "cutting edge" and the like include in their meanings the surface of the substrate, and coating layers thereupon.

The $(Al_xTi_{1-x}M_y)C_zN_{1-z}$ layer may have up to 15% by volume of a hexagonal phase. If the proportion of $(Al_xTi_{1-x}M_y)C_zN_{1-z}$ phase with hexagonal lattice is too high, wear resistance is reduced, and the tool life is shortened. An even higher proportion of $(Al_xTi_{1-x}M_y)C_zN_{1-z}$ fcc phase is advantageous to wear resistance. A preferred embodiment has up to 5 vol %, hexagonal phase, most preferably about 100 vol % of fcc phase.

The $(Al_xTi_{1-x}M_y)C_zN_{1-z}$ layer may include one or more features of known aluminum rich cubic titanium aluminum nitride or carbonitride deposited in a CVD method known in the art such as, by way of example, a columnar crystal structure with an aspect ratio, for instance, of about 2.5 to 7, a lamellar structure with periodically alternating regions with alternatingly different stoichiometric proportions of Ti and Al wherein the stoichiometric proportions of the entire layer is $0.5<x<0.95$, and/or precipitations at the grain boundaries having a higher Al content than within the grains.

The CVD coating of the invention may be manufactured by a known method in an industrial scale thermal CVD reactor as described in JP 2001/341008. Alternatively, the CVD coating may be manufactured with the method described by S. Anderbouhr et. al., in the Proceedings of the $14^{th}$ International Conference of 1997. Another known thermal CVD method for depositing a $Ti_{1-x}Al_xN$ layer onto a cemented carbide substrate that may be used is described in EP1902155. Another known thermal CVD method for depositing a $Ti_{1-x}Al_xN$ layer onto cemented carbide substrates in a hot wall low pressure CVD apparatus is described in "Aluminium-rich $Ti_{1-x}Al_xN$ Coatings by CVD"-EuroPM2006-Hard Materials Thin and Thick Coatings.

Some more examples of known CVD methods of manufacturing an aluminum rich cubic titanium aluminum nitride or carbonitride layer are disclosed in U.S. Pat. No. 6,040,012, Surface & Coatings Technology 205 (2010) 1307-1312, WO 2020/079952, U.S. Pat. No. 9,976,213, EP 3441167, and US 2018/0216224.

The trace elements of chlorine and/or argon that may be in the coating result from the gasses used in the CVD process such as, by way of example, Ar as an optional carrier gas, $TiCl_4$ and $AlCl_3$. These trace elements may be present in the layer in an amount of up to 1 atomic percent but over 1 at % is detrimental and lowers the hardness of the layer. In some embodiments the layer of $(Al_xTi_{1-x}M_y)C_zN_{1-z}$ has no trace element, i.e., y=0, this layer having improved mechanical properties. In some embodiments z=0, i.e., the layer is of $(Al_xTi_{1-x}M_y)N$ or $(Al_xTi_{1-x})N$.

The cutting insert substrate may be any substrate known for cutting inserts. In a preferred embodiment the substrate is made of a hard metal, also known as cemented carbide, made of tungsten carbide and cobalt and optionally carbides, nitrides or carbonitrides of the elements of groups IVa to VIIa of the periodic table. In some embodiments the cemented carbide substrate may have a 3-free zone that improves the toughness of the substrate body and is particular for machining steel while other embodiments, such as, by way of example machining cast irons, do not have a 3-free zone. In other embodiments the substrate may be a cermet, high speed steel, ceramics, cubic boron nitride sintered substrates and silicon nitride sintered substrates. A substrate of the cutting insert may be cemented carbide having a composition of, by way of example, WC 90.5% by mass, $Cr_3C_2$ 0.5% by mass, Co 9% by mass, is sintered into a cutting tool geometry.

In some embodiments the rake face may be a flat surface while some embodiments may have additional features such as, by way of example, a chip breaker. Similarly, this applies to the relief face as well which may be chamfered, formed into a surface that is not flat.

In some embodiments, the coating is made of a single layer $(Al_xTi_{1-x}M_y)C_zN_{1-z}$. In other embodiments the coating may have one or more additional layers. The one or more additional layers may be of carbides, nitrides, oxides, carbonitrides, oxynitrides, oxycarbides, oxycarbonitrides, borides, boronitrides, borocarbides, borocarbonitrides, boroxynitrides, boroxycarbides or boroxycarbonitrides of the elements of groups IVa to VIIa of the periodic table and/or aluminium, mixed metal phases and phase mixtures of the afore-mentioned compounds.

Preferred additional layers comprise carbides, nitrides, or carbonitrides of titanium. In some embodiments the coating does not comprise a layer of alumina.

In a preferred embodiment the coating has an underlayer of TiN between the substrate and the layer of $(Al_xTi_{1-x}M_y)C_zN_{1-z}$ and the substrate is cemented carbide. In other embodiments the underlayer has a layer of TiN and a layer of TiCN.

In some embodiments the layer of $(Al_xTi_{1-x}M_y)C_zN_{1-z}$ is the outermost layer of the coating.

In other embodiments the coating further comprises an outermost layer of TiN. The outermost TiN layer has the advantages of wear indication and/or easily detectable grade marking. In some embodiments the outermost layer of the coating comprises a layer selected from the group of TiCN, ZrN and ZrCN, or a multilayer made of layers selected from the group consisting of TiN, TiCN, ZrN and ZrCN.

In a preferred embodiment the Vickers hardness of the $(Al_xTi_{1-x}M_y)C_zN_{1-z}$ layer satisfies a relationship $|HV_1-HV_2|<500$, preferably $|HV_1-HV_2|<300$, most preferably $|HV_1-HV_2|<100$ wherein $HV_1$ is the Vickers hardness measured on the rake face and $HV_2$ is the Vickers hardness measured on the relief face. The Vickers hardness measured on the rake face can be within the range of $2300<HV_1<4200$, preferably $2600 \le HV_1 <3800$, more preferably $2900 \le HV_1 <3400$, and the Vickers hardness measured on the relief face can be within the range of $2400 \le HV_2 <4000$, preferably $2700 \le HV_2 <3600$, more preferably $3000 \le HV_2 <3500$. The combination, according to this embodiment, of the regulation of the residual stress of the CVD $(Al_xTi_{1-x}M_y)C_zN_{1-z}$ layer, preferably high aluminum CVD $(Al_xTi_{1-x}M_y)C_zN_{1-z}$ layer, $S_1$ and $S_2$ on the rake and the relief faces respectively to their defined respective ranges, and the control of the difference of residual stress, $|S_1-S_2|$, together with the regulation of the Vickers hardness range of $HV_1$ and the Vickers hardness range of $HV_2$ and the Vickers hardness range of $|HV_1-HV_2|$ results in cutting inserts with increased resistance to chipping, improved wear resistance and significantly longer tool life especially in milling and turning of iron-based workpieces over known cutting inserts whose tool life may be cut short by relief face wear, and/or chipping at the cutting edge, especially in milling inserts, and thermal fatigue due to thermal cyclic loads that result in thermal cracks along the cutting edge, which reach completely through the coating eventually causing sections of carbide to pull out and end up as chipping.

The furnace may be any CVD furnace such as, by way of example, Bernex reactors of the BBXpro models or, 750L 750S 530L 530S 325L 325S models. In some embodiments the chemical vapor deposition process is enhanced with plasma activation.

In another aspect of the invention, there is a method of treatment of the coated cutting insert according to the invention after the deposition of a CVD coating having at least one layer of $(Al_xTi_{1-x}M_y)C_zN_{1-z}$ upon the substrate, having stoichiometry coefficient in terms of atomic percent $0.30<x<0.95$, preferably $0.50<x<0.95$, more preferably $0.67\leq x<0.95$, and advantageously $0.80<x<0.90$, $0\leq y<0.01$, $0\leq z<0.3$ and M is at least one element selected from the group consisting of Cl and Ar. The rake face and/or the relief face are subjected to post coating mechanical treatment(s) such as blasting treatment or brushing that modify a residual stress on the rake face and/or the relief face. The term "blasting" will include wet blasting, dry blasting, jet blasting, shot peening.

A person skilled in the art will be familiar with known methods of modification of the residual stress of such coatings, having at least one layer of $(Al_xTi_{1-x}M_y)C_zN_{1-z}$, such as, by way of example, WO2020079952, describing a blasting process preferably performed along the cutting edge portion while rotating the cutting tool such that a straight line passing through the center of the rake face and perpendicular to the rake face serves as the axis (for example, 60 rpm) with alumina particles at a 45° at a distance of 50 mm for 10 seconds. Another example is EP3441167 describing a wet blasting process of a coating including a layer of nitride or carbonitride of $Al_xTi_{1-x}$ with alumina balls having an average particle diameter of 50 mm, a density of 10 volume %, a projection pressure of 0.2 MPa from a projection distance of 10 mm, for a projection time of 10 seconds. Another example of a known blasting process is described in U.S. Pat. No. 9,976,213 and may be a dry or wet blasting treatment at blasting agent pressure of 1-10 bars for 10-600 seconds preferably at a blasting angle of 90° in which the blasting pressure has a substantially greater influence on the change in the residual stresses in the coating over the blasting duration.

A broad sweeping blasting process is not possible to disclose seeing as residual stresses which occur depend not only on the blasting parameters but also the structure and the thickness of the overall coating. Nevertheless, given known post-coating treatments, a skilled person will be able to conduct a few simple experiments to determine blasting parameters of the rake face and/or the relief face so that the difference between the residual stress of the rake face and of the relief face will not be greater than 500 MPa taking into consideration the structure and thickness of the overall coating together with the structure and composition of the substrate and the blasting media selected for the process. The parameters may include blasting pressure, blasting duration, blasting angle, nozzle diameter, distance between the nozzle and the rake and relief face of the inserts and the blasting treatment, and movement of the nozzles over the blasted surface. It is well within the knowledge of a skilled person to determine the parameters having a working knowledge of their respective standard deviations, usually resulting in a cumulative standard deviation of the residual stress even for the identical blasting conditions.

The blasting duration is in the region of 2 to 600 seconds but can also be limited to the range of 5 to 60 seconds. The blasting angle is the angle between the blasting stream, from the nozzle to the blasted surface, and the respective blasted surface and may be between 0° and 90°. Suitable blasting agent pressures are in the region of 0.5 to 10 bar, preferably 1 to 4.5 bar.

The blasting agent or medium can be, for example, metallic, glass, or ceramic particles, optionally round particles, steel, SiC, $Al_2O_3$, glass or $ZrO_2$. The inherent stress conditions according to the invention can be set with any of the stated or other suitable blasting agents. With knowledge of the invention, the person skilled in the art can select a medium which is desirable from method, technical installation or tribological points of view, and can arrive at suitable blasting parameters by simple tests. The mean grain size of the blasting agent is desirably in the region of 90 to 400 mesh preferably 180 to 320 mesh. The blasting medium is propelled against the surface by a compressed air in a dry blasting process or by pressurized fluid in a wet blasting process.

The blasting angle, i.e., the angle between the treatment beam and the surface of the tool, has a substantial influence on the reduction of tensile residual stress or the introduction of compressive residual stress. The maximum change in residual stress occurs with a blasting angle of 90°.

It is possible to obtain a difference in residual stress between the rake and relief faces in accordance with claim 1, by way of example, by blasting both faces at 45° with the same medium for slightly different amounts of time and/or at slightly different pressures. An alternative blasting process may be blasting both faces for the same amount of time and/or at the same pressure but at different blasting angles on the rake face/relief face such as, by way of example, 60°/30° or 90°/45°. An alternative blasting process may be blasting only one of the faces for a short blasting time and/or slight blasting pressure as long as the difference in residual stress will be less than 500 MPa. The invention however is not restricted to these and the below-mentioned blasting treatment processes.

After the blasting treatment, the $(Al_xTi_{1-x}M_y)C_zN_{1-z}$ layer satisfies a relationship $10<|S_1-S_2|<500$ MPa, preferably $10<|S_1-S_2|<400$ MPa most preferably $10<|S_1-S_2|<350$ MPa wherein $S_1$ is the residual stress measured on the rake face and $S_2$ is the residual stress measured on the relief face. Residual stress $S_1$ may advantageously be within the range of $|S_1|<3100$ MPa, preferably $|S_1|<2800$ MPa, more preferably $-2200<S_1<2400$ MPa. Residual stress $S_2$ may advantageously be within the region of $|S_2|<2800$ MPa, preferably $|S_2|<2500$ MPa and most preferably $-1700\leq S_2<1900$ MPa.

Residual stress is usually measured in a non-destructive and phase selective X-ray diffraction method. One commonly used method is the $\sin^2\Psi$ method that uses a Point/Line type detector. When measuring the residual stress of cubic $(Al_xTi_{1-x}M_y)C_zN_{1-z}$, the relatively low angle at which the measured (200) reflection occurs may result in difficulty in using this method seeing as high 2θ peaks may not be available or appropriate for thin films and coatings.

The method of measurement of residual stress used by the inventors is the Single Tilt method (see U.S. Pat. No. 10,416,102 and Materials Research Proceedings Vol. 6 (2018) pp 3-8) which utilizes a 2-Dimensional detector. The method performs an X-ray diffraction stress analysis of a sample such as a thin film or a coating. The sample has a surface with two perpendicular axes $S_1$, $S_2$ within a plane of the surface, and a third axis $S_3$ perpendicular to the sample surface plane. An X-ray beam is directed at the sample surface at a relatively low angle with regard to the surface plane. X-ray energy is diffracted from the sample and detected with a two-dimensional X-ray detector at a plurality of rotational orientations of the sample about $S_3$. The third axis $S_3$ is maintained at a constant tilt angle during the entire X-ray diffraction stress analysis, thereby avoiding the significant error associated to the movement of a cradle track of a goniometer used for the X-ray diffraction stress analysis and on which measurements at a low $2q$ angle are highly sensitive.

Figure 1:
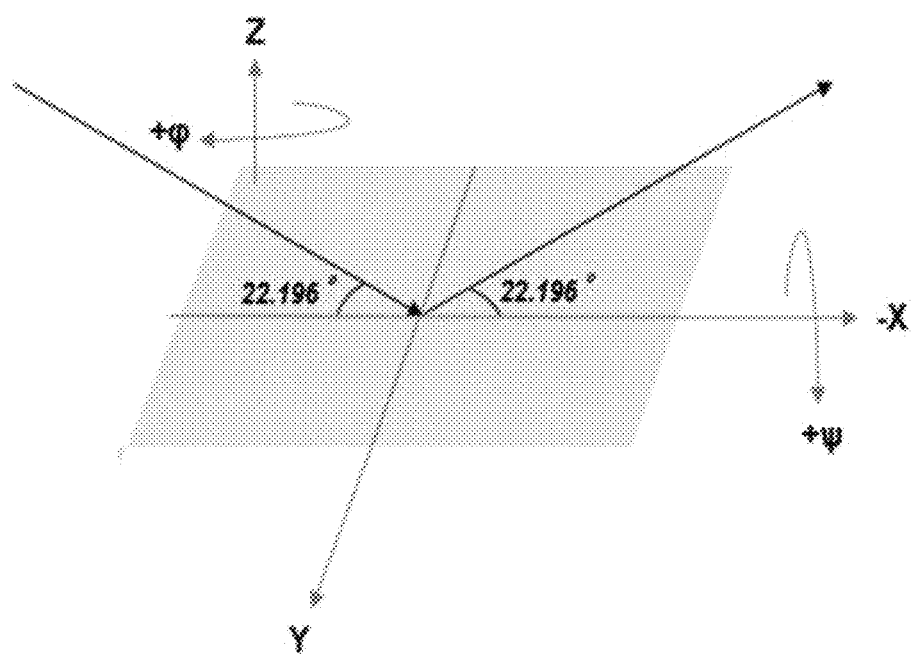
FIG. 1: The 2D detector setup of the Single Tilt Method.

The stress measured is of the cubic $(Al_xTi_{1-x}M_y)C_zN_{1-z}$ (200) planes. As shown in FIG. 7, the stress measurements of $S_1$ and of $S_2$ are taken from the vicinity of the same working corner, indicated by the circle. The diffraction vector coverage from low 2θ angle diffraction ring satisfy the stress tensor measurement at a single tilt angle. Before proceeding with the stress measurements, a calibration of the set-up (see FIG. 1) was performed. The ψ tilt for measuring the stress is chosen to be 40°.

The area detector is VANTEC-500 by BRUKER, 140 mm in diameter. The detector is mounted at a distance of 200 mm from the center of the goniometer, i.e., the center of the detector is 200 mm away from the center of the goniometer. Possible areas for positioning the goniometer center are indicated by arrows in FIG. 7. A Ni filter is used on the primary side, followed by a Polycapillary focusing optic and a 1 mm snout for point focus. For an adequate measurement with such a set-up, the intensity of the 2θ value of the observed maximum of the (200) reflection out of the total sum count of the 2D frame should be at least 0.023%. When calibrating the XRD apparatus by measuring the stress of the (113) reflection of a stress-free powder alumina sample, the apparatus is considered calibrated when the Sigma 11 & Sigma 22 of the biaxial stress tensor are 0±55 MPa which is the standard deviation of the residual stress measurements.

The biaxial stress state of the cubic $(Al_xTi_{1-x}M_y)C_zN_{1-z}$ (200) planes can now be measured. It is calculated using 8 frames differing in y angle, while, as already stated, the sample for all frames is tilted 40° around the X axis (ψ tilt). Rotation around the Z axis (angle φ) is 0° for the first frame and 3150 for the 8th frame, with increments of 450 between the frames. The frames acquisition is limited not by time, but by a total number of counts, the value set in this work is 10,000,000 counts. The actual total sum count of the frames is usually less than that value, but no less than 9,5000,000 counts. The detector and the tube are set to an angle of 21.196°, to capture the cubic $(Al_xTi_{1-x}M_y)C_zN_{1-z}$ (200) reflection somewhere in the middle of the detector. The integration for the stress calculation is performed on the y range from 249° to 292°, while the 2θ range is set to be ±1° to the observed maximum value of the (200) reflection of the first frame (ψ=40°; φ=0°). The 2θ range for the stress measurement will be from 43.483° to 45.483° shown in FIG. 5b. Then, this is divided into 20 subregions, peak rejection is 20% and the step is 0.1°. Peak evaluation is by the Pearson VII method. Crystallographic data used is 0.238 for the Poisson value and 330667 [MPa] for Young's Modulus. The value of $|S_1-S_2|$ can be calculated as either $|\sigma11_1-\sigma11_2|$ or $|\sigma22_1-\sigma22_2|$, wherein $\sigma11_1$ and $\sigma22_1$ are the σ11 and σ22 values in the obtained biaxial stress tensor of the rake face, and $\sigma11_2$ and $\sigma22_2$ are the σ11 and σ22 values in the obtained biaxial stress tensor of the relief face respectively. The biaxial stress tensor is shown below.

$$\begin{bmatrix} \sigma11 & \sigma12 & - \\ \sigma12 & \sigma22 & - \\ - & - & - \end{bmatrix}$$

Figure 5A:
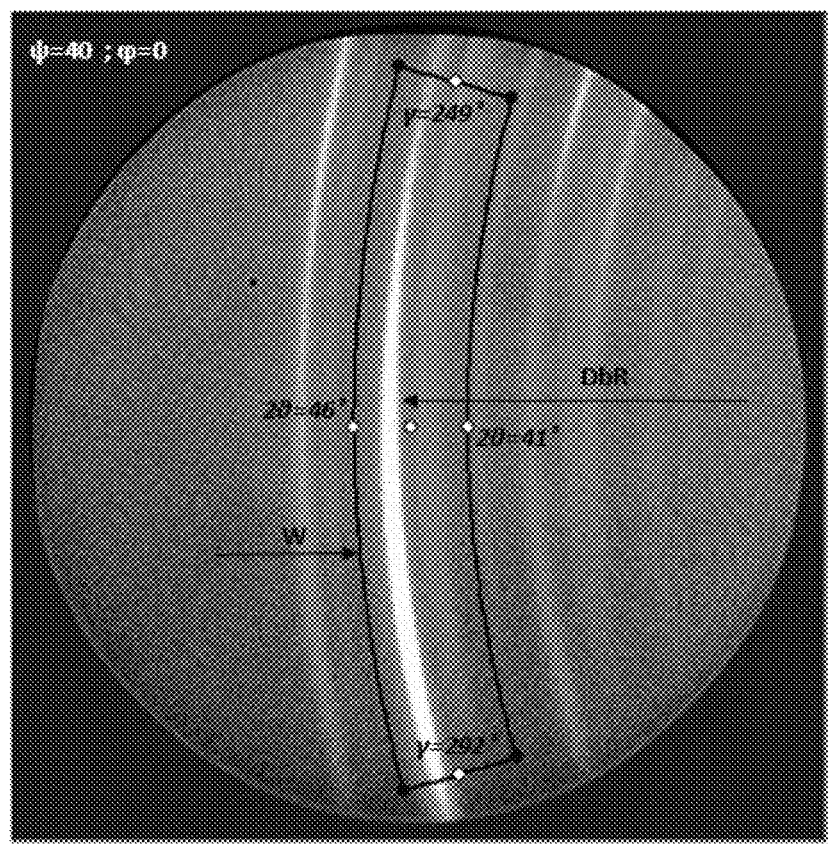
FIG. 5a: A single XRD 2D frame for residual stress evaluation.
Figure 5B:
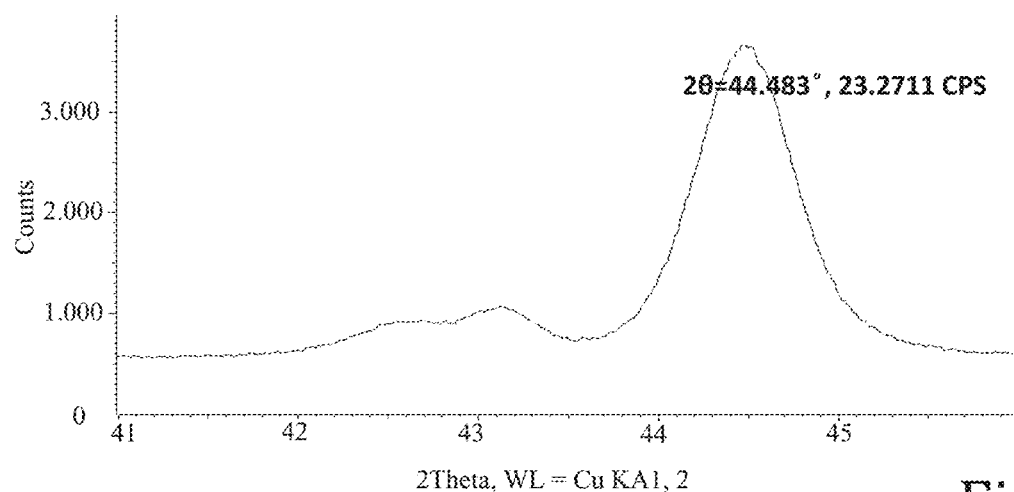
FIG. 5b: The integration of that frame to a 1D spectrum.

To show how the intensity of the 2θ value of the observed maximum of the (200) reflection out of the total sum count of the 2D frame is obtained, FIG. 5a shows a single XRD 2D frame for residual stress evaluation of the cubic $(Al_xTi_{1-x}M_y)C_zN_{1-z}$ having a detector sum count for the frame of 9,475,328 counts and a total frame collection time of 156.98 seconds. FIG. 5b shows the integration of that frame to a 1D spectrum, the integration is performed on a wedge (W of FIG. 5a) that encompasses 2θ range of 410 to 460 and from a gamma value of 249° to a value of 292°. The integrated peak Observed Maximum is at 2θ=44.483° with a Gross Intensity of 23.2711 CPS. 23.2711 CPS×156.98 Seconds=3,653 Counts. The intensity of the 2θ value of the observed maximum of the (200) reflection, the De-Bye ring shown in FIG. 5a, DbR, out of the total sum count of the 2D frame equals (3,653 counts/9,475,328 counts)×100=0.038% which is greater than 0.023% as defined above.

The significance of a strong (200) reflection at a ψ=40° tilt is that the cubic $(Al_xTi_{1-x}M_y)C_zN_{1-z}$ has a (111) texture with enough grains scattered around the X axis so to complete the dihedral angle between the (111) and the (200) planes, together with the 400 ψ tilt. We can also note the texture effect from the non-uniform intensity across the De-Bye ring, see DbR of FIG. 5a.

Figure 6A:
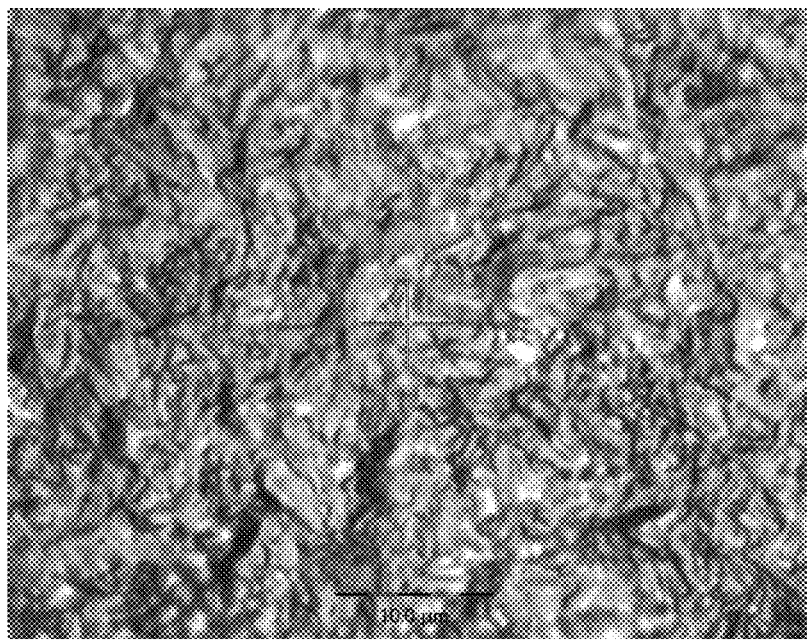
FIG. 6a: The unpolished surface of the insert with an ×100 lens of NHT3 Nanoindentation tester manufactured by Anton Paar GmbH.
Figure 6B:
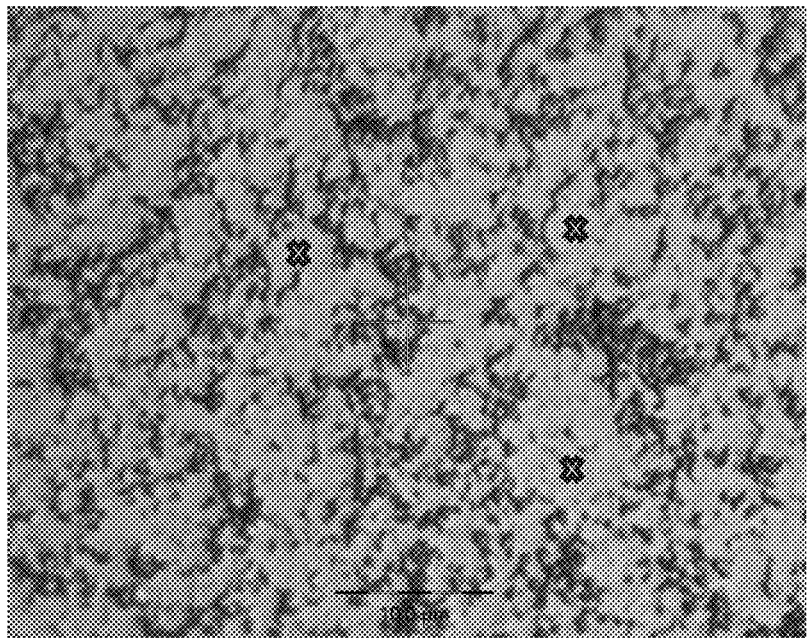
FIG. 6b: The polished surface of the insert with an ×100 lens of NHT3 Nanoindentation tester manufactured by Anton Paar GmbH wherein the Xs indicate appropriate locations for nanoindentation measurement.

Nano-Hardness measurements were performed on a NHT3 Nanoindentation tester manufactured by Anton Paar GmbH. A Berkovich Diamond Nanoindenter penetrated the samples at a linear loading rate of 120 mN/min, up to a maximal load of 35 mN. Before the tests, the samples underwent a treatment to make the surface suitable for such a test. Surface roughness affects the nanoindenter penetration process immensely. To provide the appropriate surface quality, the samples were gently hand polished on a soft fiber pad, rotating at 150 rpm, soaked in colloidal 50 nm $SiO_2$, for about 60 seconds. FIG. 6a shows a sample surface before polishing and FIG. 6b shows the same surface after polishing. The Xs in FIG. 6b indicate appropriate locations for nanoindentation measurement. The Vickers hardness values presented are the average values of 20 indentations, performed in close proximity to each other. Poisson ratio was set to 0.28.

EXAMPLES

While the present invention will be described in more detail by way of examples, it is to be understood that the present invention is not limited thereto.

Example 1

A substrate of cemented carbide was prepared from a cemented carbide powder having a composition of 89.5% of WC, 10% Co, up to 0.5% additional components such as $Cr_3C_2$ or VC, all by mass %, that was sintered into indexable inserts such as CNMG 432 M3P having a rake face and a relief face that intersect to form a cutting edge.

The inserts were coated according to an industrial CVD process in a standard thermal furnace, used for coating metal cutting tools, with a TiN layer on the substrate and a $(Al_xTi_{1-x}Cl_y)N$ layer with the method disclosed in JP 2001/341008. The TiN layer having a thickness of 0.3 m was first formed on the substrate surface using an $H_2$ carrier gas, a TiCl$_4$ gas and an N$_2$ gas at 900° C. The TiAlN layer having a thickness of about 8 m is then formed at a temperature within the range of 700 to 900° C. The gasses used are TiCl$_4$ gas: 0.05-4.0 vol %, AlCl$_3$ gas: 0.03-2.5 vol %, NH$_3$ gas: 0.05-3.0 vol %, the carrier gases being H$_2$ and N$_2$ flowed into the reactor at a pressure in the range of 2.7 to 15.9 KPa.

The coated inserts were blasted with a SiC at respective blasting stream angles (having a standard deviation of ±5°) from a nozzle having a diameter of 0.8 mm wherein the distance between the nozzle and inserts is 10 mm (±0.3 mm). The blasting of the rake and the relief faces, i.e., the blasting times, blasting pressures, blasting medium, and blasting angles, were selected so as to result in different respective residual stresses on the rake and relief faces having a difference of less than 500 MPa. Three examples of blasting parameters are given below.

Three samples of metal cutting tools of the invention that underwent post coating treatment A, of the invention, were blasted with SiC F180, a commonly used blasting medium, and are listed in Table 1.

TABLE 1

| Sample | Face | Blasting Angle [°] | Pressure [bar] | Blasting Time | $\|S_1 - S_2\|$ [MPa] | S [MPa] |
|---|---|---|---|---|---|---|
| A1 | Rake | 45 | 2 | 20 sec | 378 | −199 |
|  | Relief | 45 | 2 | 40 sec |  | −577 |
| A2 | Rake | untreated | — | — | 260 | 1284 |
|  | Relief | 90 | 1 | 20 sec |  | 1024 |
| A3 | Rake | 90 | 2 | 20 sec | 106 | −668 |
|  | Relief | 90 | 2 | 20 sec |  | −562 |

Four comparative samples of metal cutting tools underwent a post coating treatment B of blasting with SiC F180 and are in shown in Table 2.

TABLE 2

| Sample | Face | Blasting Angle [°] | Pressure [bar] | Blasting Time | $\|S_1 - S_2\|$ [MPa] |
|---|---|---|---|---|---|
| B1 | Rake | untreated | — | — | 1960 |
|  | Relief | 90 | 2 | 20 sec |  |
| B2 | Rake | 90 | 2 | 20 sec | 728 |
|  | Relief | 90 | 2 | 40 sec |  |
| B3 | Rake | 90 | 2 | 20 sec | 911 |
|  | Relief | 90 | 3 | 20 sec |  |
| B4 | Rake | 45 | 2 | 20 sec | 1113 |
|  | Relief | 45 | 2 | 60 sec |  |

Example 2

The residual stress was measured on both the rake and the relief faces after the blasting treatment using the single tilt method for residual stress evaluation. The area detector is VANTEC-500 by BRUKER having a diameter of 140 mm. The results are shown in Table 1 and $|S_1-S_2|$ for treatment B is given in Table 2.

Nano-Hardness measurements were performed on a NHT3 Nanoindentation tester manufactured by Anton Paar GmbH. The samples were gently hand polished on a soft fiber pad, rotating at 150 rpm, soaked in colloidal 50 nm SiO$_2$, for about 60 seconds and were then penetrated with a Berkovich Diamond at a linear loading rate of 120 mN/min, up to a maximal load of 35 mN. The Vickers hardness values presented are the average values of 4 samples, each sample value is the average of 20 indentations, performed in close proximity one to the other. Poisson ratio was set to 0.28.

The results are given in Table 3. The results of comparative sample B1 Vickers hardness are in shown in Table 4.

TABLE 3

| Face | E* [GPa] | EIT [GPa] | HIT [GPa] | HV$_{0.0035}$ | $\|HV_1 - HV_2\|$ |
|---|---|---|---|---|---|
| Relief | 543.4 | 500.8 | 33.6 | 3115.3 | 64.3 |
| Rake | 554.3 | 510.8 | 34.3 | 3179.6 |  |

TABLE 4

| Face | E* [GPa] | EIT [GPa] | HIT [GPa] | HV$_{0.0035}$ | $\|HV_1 - HV_2\|$ |
|---|---|---|---|---|---|
| Relief | 575.4 | 530.3 | 32.0 | 2962.0 | 615.3 |
| Rake | 521.4 | 480.5 | 25.3 | 2346.7 |  |

Example 3

Eight inserts having a geometry of LNHT 1306 PNTR were coated with a (Al$_{0.83}$Ti$_{0.17}$Cl$_{0.004}$)N layer in a CVD reactor. Four inserts underwent post coating treatment resulting in $|S_1-S_2|$ of A2 in Table 1, i.e., A2i, A2ii, A2iii and A2iv, and four comparative inserts with the same geometry with post coating treatment B resulting in $|S_1-S_2|$ of B2 in Table 2, i.e., B2i, B2ii, B2iii and B2iv.

Samples A2i, A2ii, B2i, and B2ii were tested in a dry milling test on workpiece 1 of cast iron grade GGG50 and the rake faces and cutting edges after the dry milling test are shown in FIG. 3a-FIG. 3d respectively, all of which are pictures taken with an optical microscope. The machining parameters were Vc=230 m/min, f=0.2 mm/rev, Ap=4.0 mm, A$_e$=27 mm wherein A$_e$ is the cutting width.

Samples A2iii, A2iv, B2iii, and B2iv were tested in a wet milling test on workpiece 2 of steel grade SAE4340. The rake faces and cutting edges of these samples after the wet milling test are shown in FIG. 4a-FIG. 4d respectively, all of which are pictures taken with an optical microscope. The wet milling test parameters were Vc=200 m/min, f=0.16 mm/rev, Ap=2.0 mm, A$_e$=40 mm.

Figure 2A:
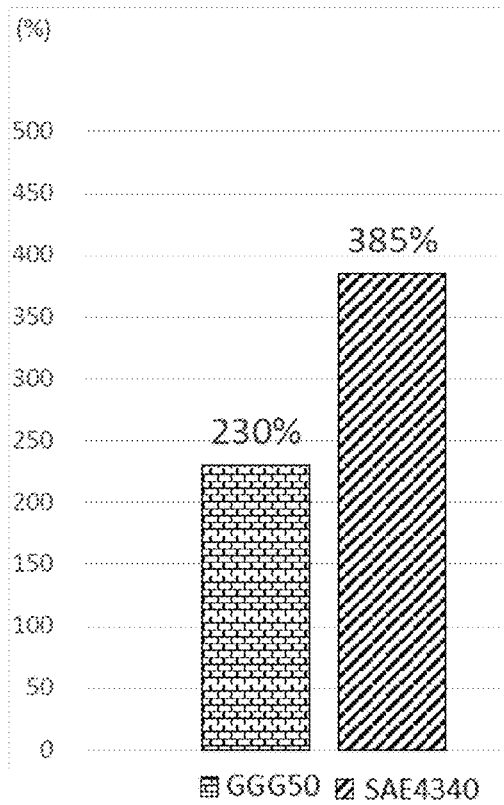
FIG. 2a: Tool lives of samples A2i and A2ii on two different workpieces normalized with tool life of comparative prior art samples B2i and B2ii.
Figure 2B:
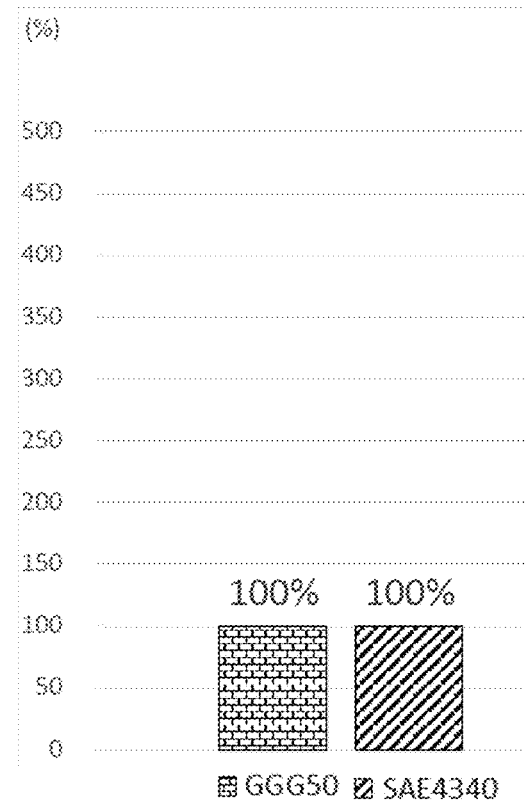
FIG. 2b: tool lives of comparative samples B2i and B2ii.
Figure 3A:
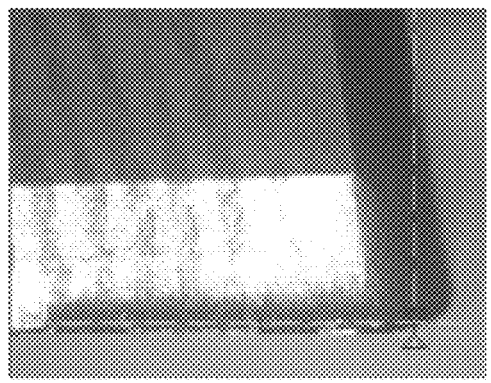
FIG. 3a: Picture of rake and cutting edge of Sample A2i after milling a GGG50 workpiece for 28 minutes.
Figure 3B:
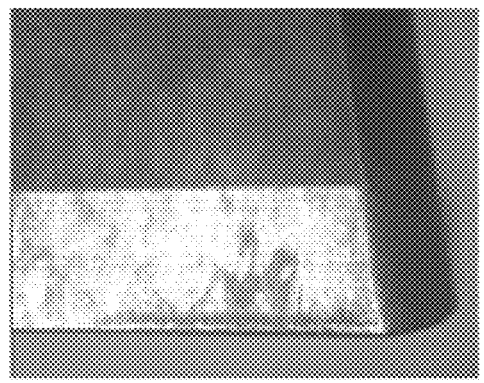
FIG. 3b: Picture of rake and cutting edge of Sample A2ii after milling a GGG50 workpiece for 32 minutes.
Figure 3C:
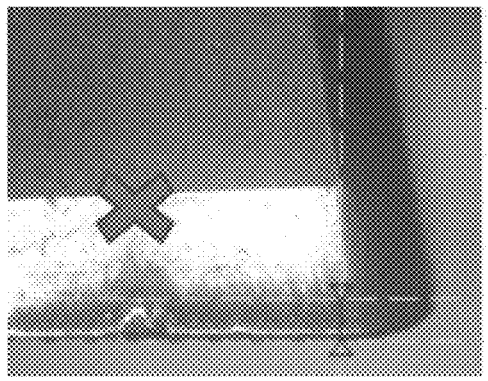
FIG. 3c: Picture of rake and cutting edge of Sample B2i after milling a GGG50 workpiece for 28 minutes.
Figure 3D:
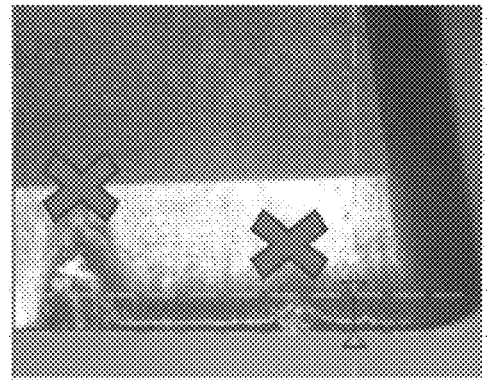
FIG. 3d: Picture of rake and cutting edge of Sample B2ii after milling a GGG50 workpiece for 28 minutes.

The average of the tool lives of samples A2i and A2ii has a very substantial increase of 230% as shown in FIG. 2a over the average of the tool lives of comparative samples B2i and B2ii shown in FIG. 2b after normalization of the lifetime of the average of these samples as 100%. The Y axis of FIG. 2a and FIG. 2b is the average normalized lifetime (%). The rake face and the cutting edge of sample A2i are shown in FIG. 3a and of sample B2i are shown in FIG. 3c after 28 and 32 minutes respectively, wherein sample B2i in FIG. 3c shows very conspicuous chipping.

Figure 4A:
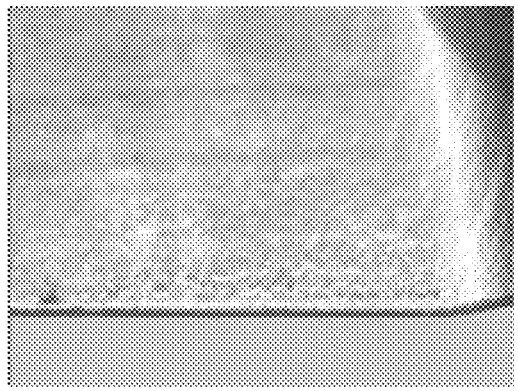
FIG. 4a: Picture of rake and cutting edge of Sample A2iii after milling a SAE4340 workpiece 1.7 m.
Figure 4B:
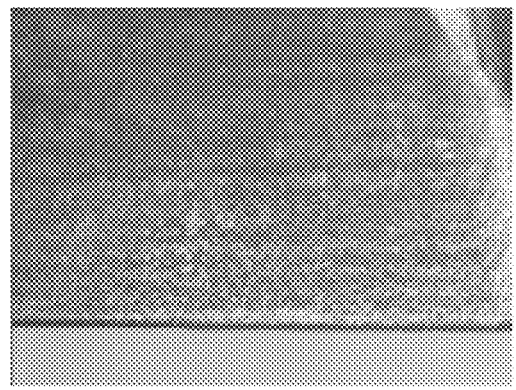
FIG. 4b: Picture of rake and cutting edge of Sample A2iv after milling a SAE4340 workpiece 4.8 m.
Figure 4C:
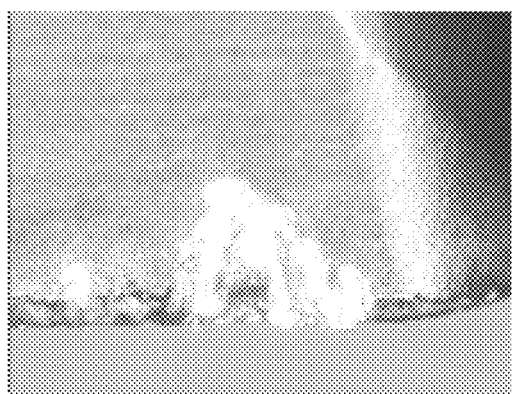
FIG. 4c: Picture of rake and cutting edge of comparative Sample B2iii after milling a SAE4340 workpiece 1.7 m.
Figure 4D:
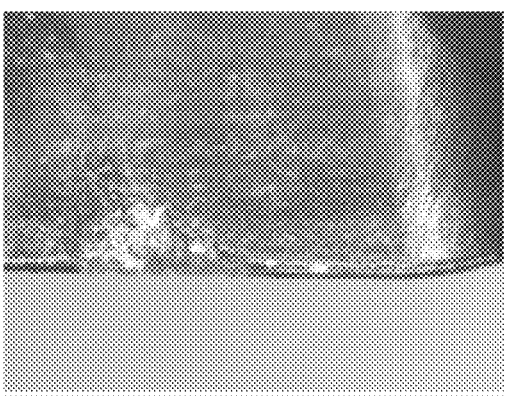
FIG. 4d: Picture of rake and cutting edge of comparative Sample B2iv after milling a SAE4340 workpiece 4.8 m.

The average of the tool lives of samples A2iii and A2iv has a remarkable increase of 385% in tool life in milling of SAE4340 as shown in FIG. 2a over the average of the tool lives of samples B2iii and B2iv shown in FIG. 2b after normalization of the lifetime of the average of these samples as 100%. The rake face and the cutting edge of sample A2iii are shown in FIG. 4a and of sample A2iv are shown in 4c after 28 and 32 minutes respectively with no damage, whereas sample B2iii in FIG. 4b shows significant chipping and sample B2iv in FIG. 4d shows catastrophic chipping both after 28 minutes of milling.

What is claimed is:

1. A metal cutting insert comprising a substrate body and a chemical vapor deposition (CVD) coating over the substrate body, the substrate body is of cemented carbide, cermet, or ceramic;

the substrate body comprises at least one rake face and at least one relief face that intersect to form a cutting edge, the CVD coating is formed on the substrate body by a chemical vapor deposition process and comprises one or more layers wherein at least one layer has a composition comprising aluminum, titanium and nitrogen having a cubic face centered lattice structure, represented by a formula $(Al_xTi_{1-x}M_y)C_zN_{1-z}$ wherein a stoichiometry coefficient of aluminum is $0.30<x<0.95$, wherein M is at least one element selected from the group consisting of Cl and Ar, with a stoichiometry coefficient of which is $0\leq y<0.01$, and wherein a stoichiometry coefficient of carbon is $0\leq z<0.3$;

characterized in that:

the chemical vapor deposition process results in coated surfaces of the substrate body having a tensile residual stress; and the $(Al_xTi_{1-x}M_y)C_zN_{1-z}$ layer satisfies a relationship $10<|S_1-S_2|<500$ MPa, wherein $S_1$ is the residual stress measured on the rake face, and $S_2$ is the residual stress measured on the relief face.

2. The metal cutting insert according to claim 1, wherein y=0.

3. The metal cutting insert according to claim 1, wherein z=0.

4. The metal cutting insert according to claim 1, wherein the chemical vapor deposition process is without plasma activation.

5. The metal cutting insert according to claim 1, wherein a thickness of the CVD coating is between 2 to 25 μm.

6. The metal cutting insert according to claim 1, wherein $|S_1|<3100$ MPa, and wherein $|S_2|<2800$ MPa.

7. The metal cutting insert according to claim 6, wherein z=0.

8. The metal cutting insert according to claim 6, wherein the CVD coating further comprises one or more additional layers of carbides, nitrides, oxides, carbonitrides, oxynitrides, oxycarbides, oxycarbonitrides, borides, boronitrides, borocarbides, borocarbonitrides, boroxynitrides, boroxycarbides or boroxycarbonitrides of the elements of groups IVa to VIIa of the periodic system and/or aluminium, mixed metal phases and phase mixtures of the afore-mentioned compounds.

9. The metal cutting insert according to claim 8, wherein at least one of the additional layers is selected from the group consisting of TiN and TiCN between the $(Al_xTi_{1-x}M_y)C_zN_{1-z}$ layer and the substrate body, and wherein the substrate body is cemented carbide.

10. The metal cutting insert according to claim 9, wherein none of the one or more additional layers are an alumina layer.

11. The metal cutting insert according to claim 9, further characterized in that the $(Al_xTi_{1-x}M_y)C_zN_{1-z}$ layer satisfies a relationship $|HV_1-HV_2|<500$, wherein $HV_1$ is the Vickers hardness measured on the rake face, and wherein $HV_2$ is the Vickers hardness measured on the relief face.

12. The metal cutting insert according to claim 11, further characterized in that the $(Al_xTi_{1-x}M_y)C_zN_{1-z}$ layer has a Vickers hardness $HV_1$ hardness measured on the rake face and $HV_2$ measured on the relief face, wherein $2300<HV_1<4200$, and wherein $2400\leq HV_2<4000$.

13. The metal cutting insert according to claim 1, wherein the CVD coating further comprises one or more additional layers of carbides, nitrides, oxides, carbonitrides, oxynitrides, oxycarbides, oxycarbonitrides, borides, boronitrides, borocarbides, borocarbonitrides, boroxynitrides, boroxycarbides or boroxycarbonitrides of the elements of groups IVa to VIIa of the periodic system and/or aluminum, mixed metal phases and phase mixtures of the afore-mentioned compounds.

14. The metal cutting insert according to claim 13, wherein none of the one or more additional layers are an alumina layer.

15. The metal cutting insert according to claim 13, wherein at least one of the additional layers is selected from the group consisting of TiN and TiCN between the $(Al_xTi_{1-x}M_y)C_zN_{1-z}$ layer and the substrate body, and wherein the substrate body is cemented carbide.

16. The metal cutting insert according to claim 15, wherein the CVD coating consists of a layer of TiN deposited onto the substrate body and the $(Al_xTi_{1-x}M_y)C_zN_{1-z}$ layer.

17. The metal cutting insert according to claim 1, further characterized in that the $(Al_xTi_{1-x}M_y)C_zN_{1-z}$ layer satisfies a relationship $|HV_1-HV_2|<500$, wherein $HV_1$ is the Vickers hardness measured on the rake face, and wherein $HV_2$ is the Vickers hardness measured on the relief face.

18. The metal cutting insert according to claim 17, further characterized in that the $(Al_xTi_{1-x}M_y)C_zN_{1-z}$ layer has a Vickers hardness $HV_1$ hardness measured on the rake face and $HV_2$ measured on the relief face, wherein $2300<HV_1<4200$, and wherein $2400\leq HV_2<4000$.

19. A method of production of the metal cutting insert according to claim 1, in which:

there is applied to a substrate body of cemented carbide, cermet or ceramic by means of CVD methods a CVD coating which is of a total thickness of 2 to 25 μm comprising at least one layer comprising aluminum, titanium and nitrogen having a cubic face centered lattice structure, represented by a formula $(Al_xTi_{1-x}M_y)C_zN_{1-z}$ wherein a stoichiometry coefficient of aluminum is $0.30<x<0.95$, wherein M is at least one element selected from the group consisting of Cl and Ar with a stoichiometry coefficient of which is $0\leq y<0.01$, and wherein a stoichiometry coefficient of carbon is $0\leq z<0.3$, the $(Al_xTi_{1-x}M_y)C_zN_{1-z}$ layer having a thickness of 2 to 25 μm;

and wherein after application of the CVD coating the substrate body is subjected to a blasting treatment, wherein the blasting pressure, the blasting duration, the blasting media, and/or the blasting angle of the blasting treatment are so selected that after the blasting treatment the $(Al_xTi_{1-x}M_y)C_zN_{1-z}$ layer satisfies a relationship $10<|S_1-S_2|<500$ MPa, wherein $S_1$ is the residual stress measured on the rake face, and wherein $S_2$ is the residual stress measured on the relief face.

20. A method of production of the metal cutting insert according to claim 19, wherein after the blasting treatment the $(Al_xTi_{1-x}M_y)C_zN_{1-z}$ layer further satisfies a relationship $|HV_1-HV_2|<500$, wherein $HV_1$ is the Vickers hardness measured on the rake face, and wherein $HV_2$ is the Vickers hardness measured on the relief face.

21. System for metal cutting, comprising an insert holder and at least one metal cutting insert according to claim 1, wherein the at least one metal cutting insert is mounted on the insert holder.

22. The metal cutting insert according to claim 1, wherein at least one of the at least one rake face and the at least one relief face has undergone a post coating mechanical treatment.

23. The metal cutting insert according to claim 1, wherein at least one of the at least one rake face and the at least one relief face has tensile residual stress.

24. A metal cutting insert comprising:
a substrate body and a chemical vapor deposition (CVD) coating over the substrate body,
the substrate body is of cemented carbide, cermet, or ceramic;
the substrate body comprises at least one rake face and at least one relief face that intersect to form a cutting edge,
the CVD coating comprises one or more layers wherein at least one layer has a composition comprising aluminum, titanium and nitrogen having a cubic face centered lattice structure, represented by a formula $(Al_xTi_{1-x}M_y)C_zN_{1-z}$ wherein a stoichiometry coefficient of aluminum is $0.30<x<0.95$, wherein M is at least one element selected from the group consisting of Cl and Ar, with a stoichiometry coefficient of which is $0 \leq y < 0.01$, and wherein a stoichiometry coefficient of carbon is $0 \leq z < 0.3$;
the chemical vapor deposition process results in coated surfaces of the substrate body having a tensile residual stress; and
the $(Al_xTi_{1-x}M_y)C_zN_{1-z}$ layer satisfies a relationship $10 < |S_1 - S_2| < 500$ MPa, wherein $S_1$ is the residual stress measured on the rake face, and $S_2$ is the residual stress measured on the relief face;
said metal cutting insert made by:
providing a substrate body comprising at least one rake face and at least one relief face that intersect to form a cutting edge,
applying, with a CVD process, as CVD coating comprising at least one layer of $(Al_xTi_{1-x}M_y)C_zN_{1-z}$ under conditions which results in said layer having a tensile residual stress; and
applying a post coating mechanical process so that the $(Al_xTi_{1-x}M_y)C_zN_{1-z}$ layer satisfies a relationship $10 < |S_1 - S_2| < 500$ MPa, wherein $S_1$ is the residual stress measured on the rake face, and $S_2$ is the residual stress measured on the relief face.

* * * * *